US007863918B2

(12) United States Patent
Jenkins et al.

(10) Patent No.: US 7,863,918 B2
(45) Date of Patent: Jan. 4, 2011

(54) DISPOSABLE BUILT-IN SELF-TEST DEVICES, SYSTEMS AND METHODS FOR TESTING THREE DIMENSIONAL INTEGRATED CIRCUITS

(75) Inventors: Keith A. Jenkins, Sleepy Hollow, NY (US); Seongwon Kim, Old Tappan, NJ (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 11/939,145

(22) Filed: Nov. 13, 2007

(65) Prior Publication Data

US 2009/0121736 A1    May 14, 2009

(51) Int. Cl.
*G01R 31/02* (2006.01)
(52) U.S. Cl. ........................................ 324/763; 438/14
(58) Field of Classification Search .............. 324/158.1, 324/760–765; 438/14, 17, 459, 928, 109, 438/618–622; 257/48, 778, 777
See application file for complete search history.

(56) References Cited

U.S. PATENT DOCUMENTS

| 5,252,844 | A | 10/1993 | Takagi |
| 5,426,563 | A * | 6/1995 | Moresco et al. ............. 361/689 |
| 6,248,742 | B1 | 6/2001 | Bergman et al. |
| 6,263,566 | B1 | 7/2001 | Hembree et al. |
| 6,881,597 | B2 | 4/2005 | Asayama et al. |
| 6,897,475 | B2 | 5/2005 | Wang |
| 7,253,091 | B2 * | 8/2007 | Brewer et al. ............... 438/618 |
| 2005/0037540 | A1 | 2/2005 | Pepe et al. |
| 2006/0132167 | A1 * | 6/2006 | Chen ......................... 324/765 |
| 2007/0061643 | A1 | 3/2007 | Chang |
| 2007/0096091 | A1 | 5/2007 | Wang |
| 2007/0241766 | A1 * | 10/2007 | Kamitai et al. .............. 324/763 |
| 2008/0068039 | A1 * | 3/2008 | Bernstein et al. ............. 326/16 |

FOREIGN PATENT DOCUMENTS

EP          1431241 A2    6/2004

* cited by examiner

*Primary Examiner*—Minh N Tang
*Assistant Examiner*—Trung Q Nguyen
(74) *Attorney, Agent, or Firm*—Tutunjian & Bitetto, P.C.; Anne V. Dougherty, Esq.

(57) ABSTRACT

A device and method for self-testing an integrated circuit layer for a three-dimensional integrated circuit includes integrally forming a disposable self-test circuit on a common substrate with a first circuit to be tested. The first circuit forms a layer in a three-dimensional integrated circuit structure. The first circuit is tested using circuitry of the self-test circuit. The self-test circuit is removed by detaching the self-test circuit from the first circuit.

22 Claims, 7 Drawing Sheets

DISPOSABLE BUILT-IN SELF-TEST DEVICES, SYSTEMS AND METHODS FOR TESTING THREE DIMENSIONAL INTEGRATED CIRCUITS

BACKGROUND

1. Technical Field

The present invention relates to integrated circuit testing and more particularly to a device, system and method having a disposable built-in self-test portion which can be removed after testing.

2. Description of the Related Art

Integrated circuits which are built by stacking two or more layers of conventional chips to create three-dimensional (3-D) integrated circuits have several unique problems pertaining to testability. First, given that the functional yield of circuits is generally less than 100%, assembling untested chips can result in a very low yield for the 3-D chip. Second, single layers of a stack may not have completed circuits, as they may be utilizing additional layers for function, load, or wiring, and hence, these single layers may not be testable. For example, a regulator layer may need to be tested; however, the regulator layer needs a load to properly be tested. The load is typically located on another layer.

Third, in order to test each layer, probe pads have to be placed on each tested layer. These probe pads waste silicon area since they are unused after assembly.

SUMMARY

A device and method for self-testing an integrated circuit layer for a three-dimensional integrated circuit includes integrally forming a disposable self-test circuit on a common substrate with a first circuit to be tested. The first circuit forms a layer in a three-dimensional integrated circuit structure. The first circuit is tested using circuitry of the self-test circuit. The self-test circuit is removed by detaching the self-test circuit from the first circuit.

Another method for self-testing an integrated circuit layer for a three-dimensional integrated circuit includes integrally forming a disposable self-test circuit on a common substrate with a first circuit to be tested. The first circuit forms a layer in a three-dimensional integrated circuit structure. The first circuit having the self-test circuit is joined to at least one other layer to form the three-dimensional integrated circuit structure. The three-dimensional integrated circuit structure is tested using circuitry of the self-test circuit. The self-test circuit is removed by detaching the self-test circuit from the first circuit.

An integrated circuit includes a first chip portion configured to be integrated in a three-dimensional integrated circuit structure, and a self-test portion integrated on a same substrate with the first chip portion. The self-test portion includes circuitry configured to test the first chip portion, and the self-test portion is configured to be detachable from the first chip portion to permit disposal of the self-test portion after testing the first chip portion.

A three-dimensional integrated circuit includes a first chip portion and at least one other layer bonded to the first chip portion to form a three-dimensional integrated chip. The at least one other layer includes functional devices which interact with circuitry formed on the first chip portion. A self-test portion is integrated on a same substrate with the first chip portion. The self-test portion includes circuitry configured to test at least the first chip portion, and the self-test portion is configured to be detachable from the first chip portion to permit disposal of the self-test portion after testing at least the first chip portion.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
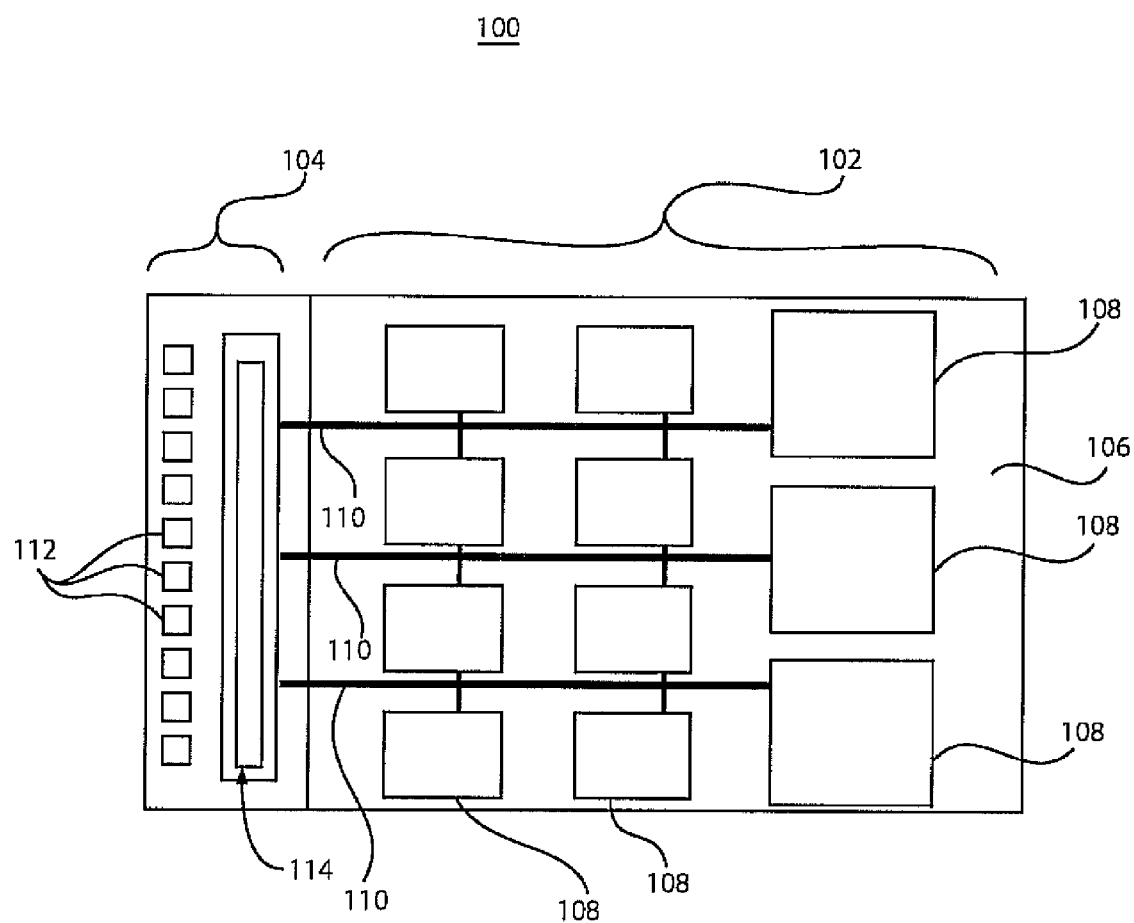
FIG. 1 is a top schematic view of a layer of a three-dimensional integrated chip structure having a first chip portion and a disposable built-in self test portion in accordance with one embodiment.

Present embodiments provide a disposable or removable testing portion for stack layers in a three-dimensional integrated circuit. Test circuits, e.g., built-in-self-test circuits, which are built into a substrate such as, e.g., a silicon wafer, are located outside a desired chip area. The test circuits can provide circuits, wiring, or loading to make the desired chip testable, have built-in test circuits to test the desired chip, and have sufficient probe pads to perform testing. After testing, and before assembly, the test circuits are detachable from the circuit or circuit layer and can be disposed of, thus providing a test without the expense of added area on the final assembled integrated circuit.

Embodiments of the present invention can take the form of an entirely hardware embodiment, which can be implemented in a substrate material, such as, silicon, silicon on insulator (SOI), Gallium Arsenide (GaAs), printed wiring boards, epoxy based substrates or any other suitable substrate material.

Embodiments as described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a top view of an integrated circuit chip or printed wiring board 100 is shown in accordance with an illustrative embodiment. Chip 100 preferably is a circuit layer that will be a portion of a three-dimensional integrated circuit. Chip 100 includes a circuit layer portion 102 and a disposable built-in-self-test (D-BIST) portion 104.

Portions 102 and 104 are preferably formed on a same substrate 106. Substrate 106 may include a silicon wafer, a silicon on insulator (SOI) wafer, a printed wiring board, a ceramic, etc. Portion 102 includes circuit blocks 108, which may include processor units, input/output units, memory units, or any of many other types of sub-circuits which may be found in integrated circuits. Wires 110 run from circuit blocks 108 to the D-BIST area 104 of the silicon wafer 106. The connecting wiring 110 between the circuit area 102 and the D-BIST area 104 may include back-end-of the line (BEOL) metal or other materials, for example, diffusion and silicide regions in the silicon substrate 106.

The D-BIST area 104 is designed in conjunction with the chip area 102 to provide testing functions. The D-BIST area 104 includes D-BIST circuits 114. Circuits 114 include wiring, passive metal structures, and devices to enable the chip portion 102 to function properly. Circuits 114 further provide sufficient loads to mimic effects of a stacked layer on the chip area 102. In other words, circuits 114 may be employed to test the single layer chip 102 or may be employed to test all or portions of a three-dimensional stack (not shown).

Built-in-self-test circuits 114 may be designed to test the chip area 102. Circuits 114 may include, for example, random data generators, bit-error-rate testers, multiple input storage registers (MISRs), variable power supply load generators, etc. Probe pads 112 are provided in D-BIST area 104 for providing power for the D-BIST area 104 and chip area 102, and to operate the D-BIST circuits 114. Probe pads 112 may be employed for performing actual measurements, for temporary connections to other chips, for reading and writing data or error information to or from the chip area 102 or the D-BIST area 104, etc.

Figure 2:
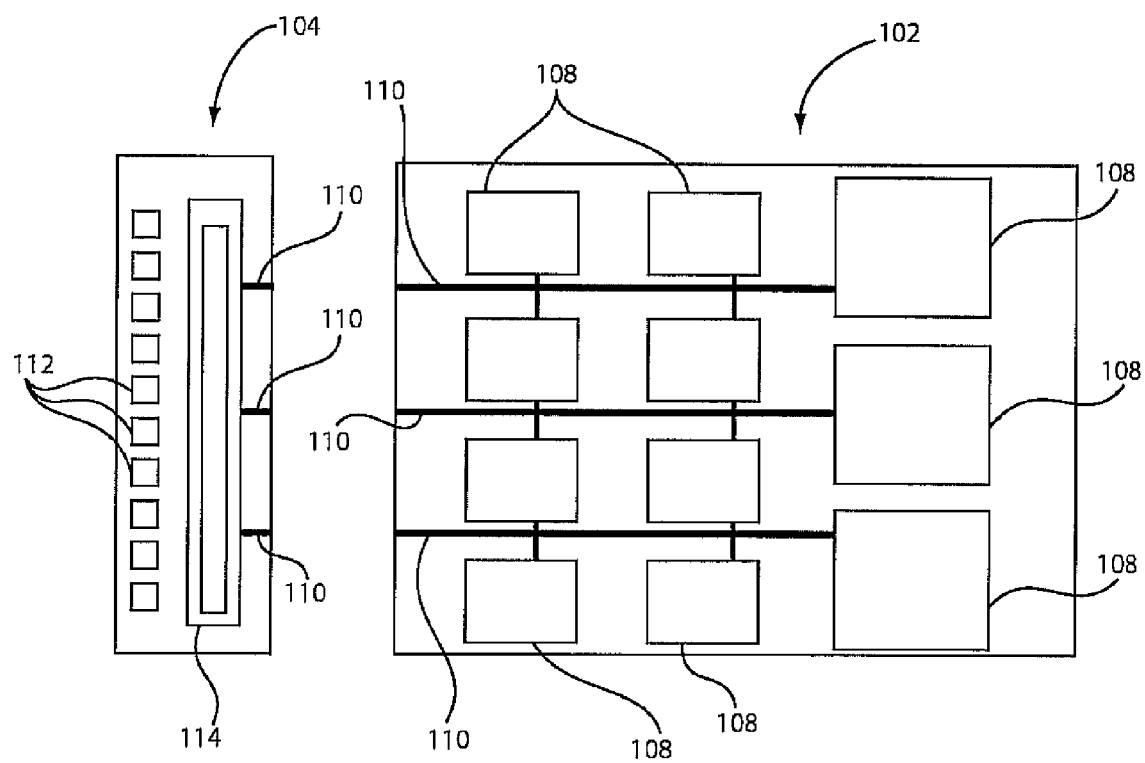
FIG. 2 is a top schematic view of the layer of FIG. 1 showing the disposable built-in self test portion detached from the first chip portion in accordance with one embodiment.

Referring to FIG. 2, portions 102 and 104 are shown separated in accordance with the present principles. If a chip 102 passes all the D-BIST tests, it is presumed good enough for assembly with other chip layers to complete a three-dimensional integrated circuit. Before assembly, the D-BIST portion 104 of the silicon wafer 106 is removed from the portion 102. The D-BIST portion 104 may be severed by, e.g., a dicing process, a mechanical breaking process an etching process, etc. Once removed, D-BIST portion 104 can be discarded or recycled.

Figure 3:
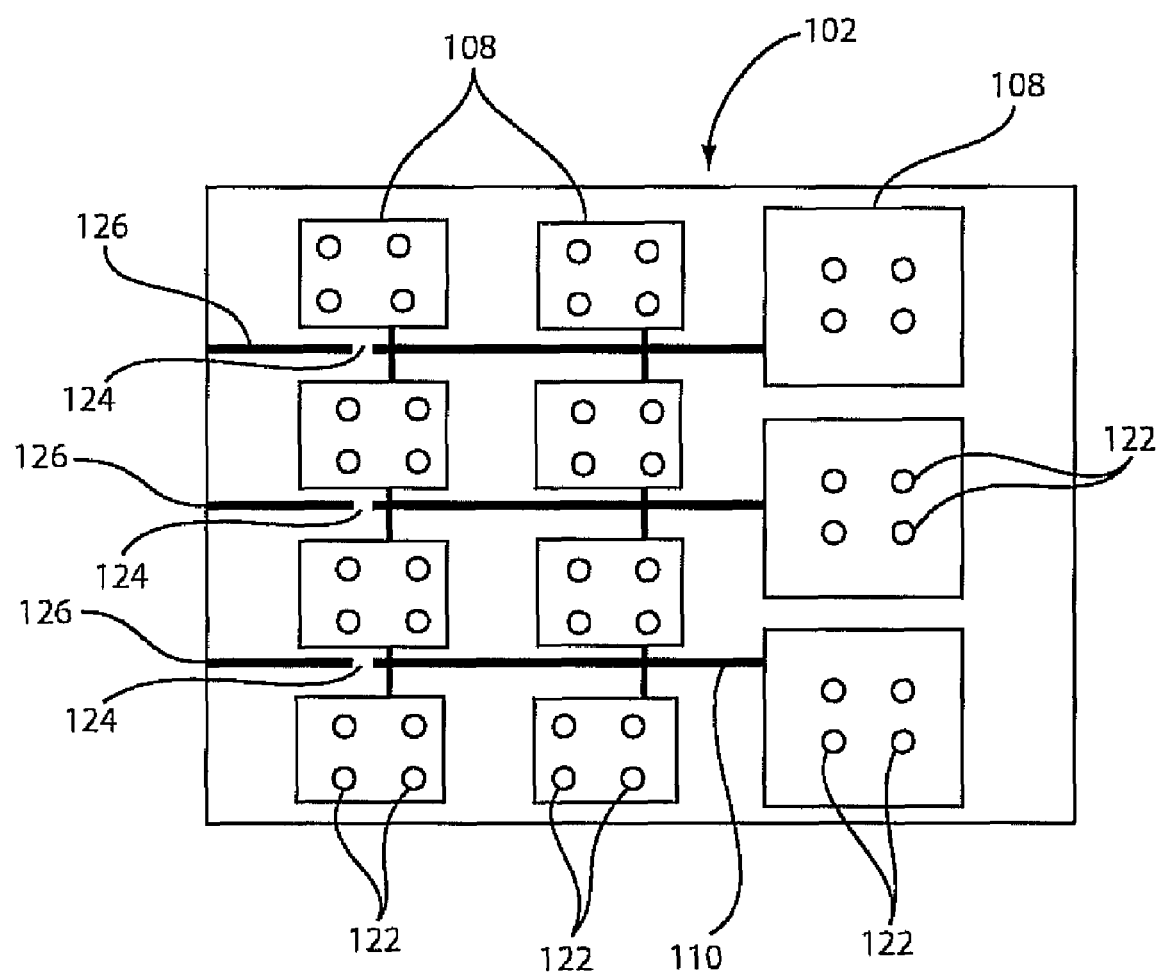
FIG. 3 is a top schematic view of the layer of FIG. 2 showing wiring connections trimmed and via structures added for connections to other layers in accordance with one embodiment.

Referring to FIG. 3, further processing may be performed on chip portion 102. For example, excess wiring 126 on the chip portion 102 may be trimmed away by opening up holes or spaces 124. Trimming may be performed by, e.g., laser ablation, photo-chemical etching or other means. If necessary, attachment structures, such as, e.g., vias 122 may then be placed on the chip portion 102 to enable electrical contact to other layers in a three-dimensional chip structure.

Figure 4:
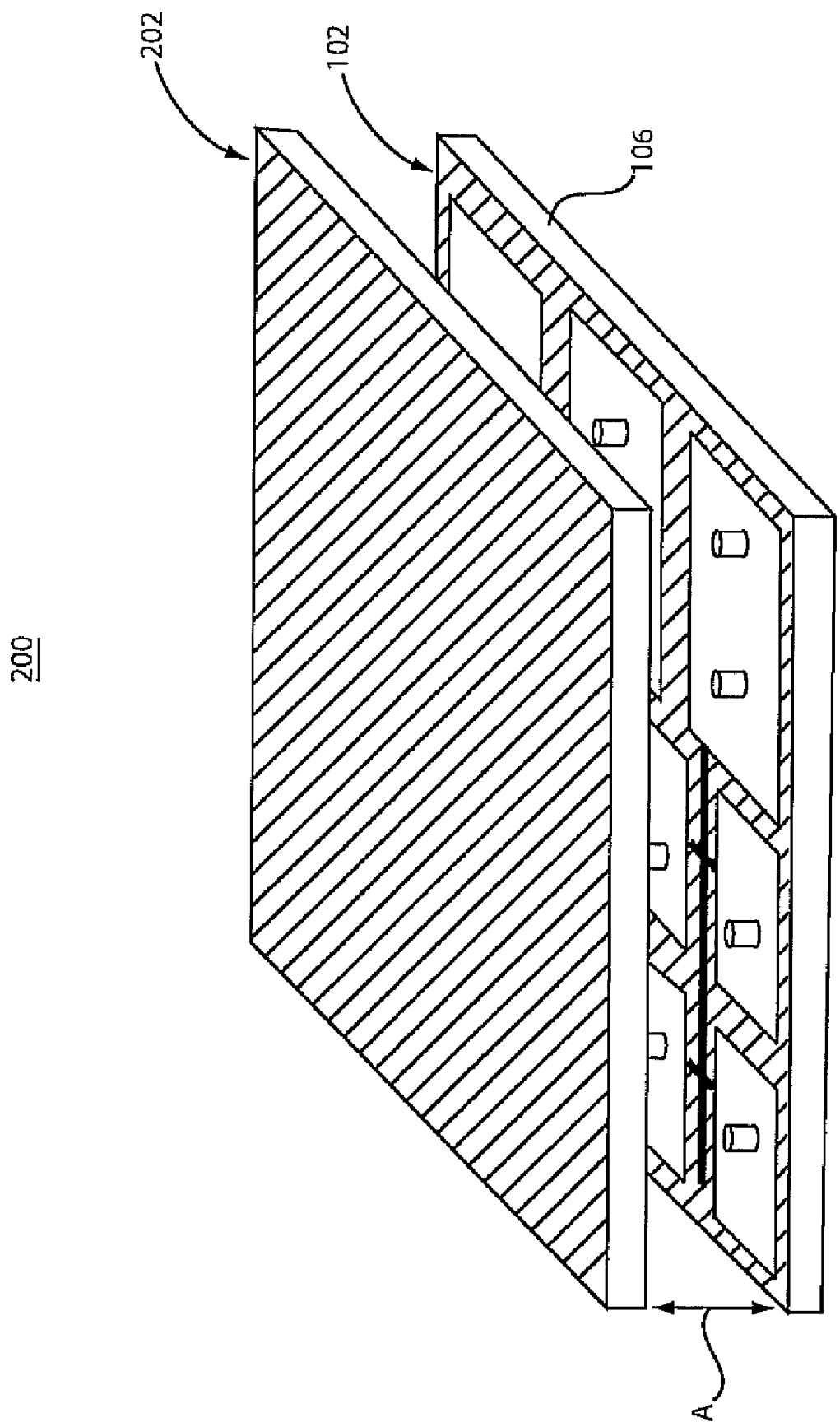
FIG. 4 is a perspective view showing layers being joined to form a three-dimensional integrated circuit chip.

Referring to FIG. 4, a three-dimensional integrated circuit 200 is fabricated from one or more chip portions 102. Chip portions 102 may include a plurality of different functions and circuits combined to provide a complete system of chip layers in a three dimensional structure. The chip portion 102 in this example is assembled by stacking it (arrow A) with other chip layers 202 which may have also been suitably tested and found to be functional. The layers 202 and 102 may be wafer bonded to provide a functional stack.

FIG. 4 shows an embodiment where each of layers 102 and 202 have been tested separately with their corresponding self-test portion (104). The self-test portions (104) have been removed prior to assembly (bonding) of the layers.

Alternatively, if full wafer bonding is needed prior to dicing, a full test program may be performed on all layers individually, simultaneously or in any combination. The D-BIST measurement results can be used to indicate which chips include working circuits at each level, thereby reducing additional test cost. The D-BIST portion (104) of the layers on the assembled three-dimensional chip can be removed and discarded after bonding, if necessary, or the D-BIST portion (104) may be disabled and remain as part of the 3-D stack.

Figure 5:
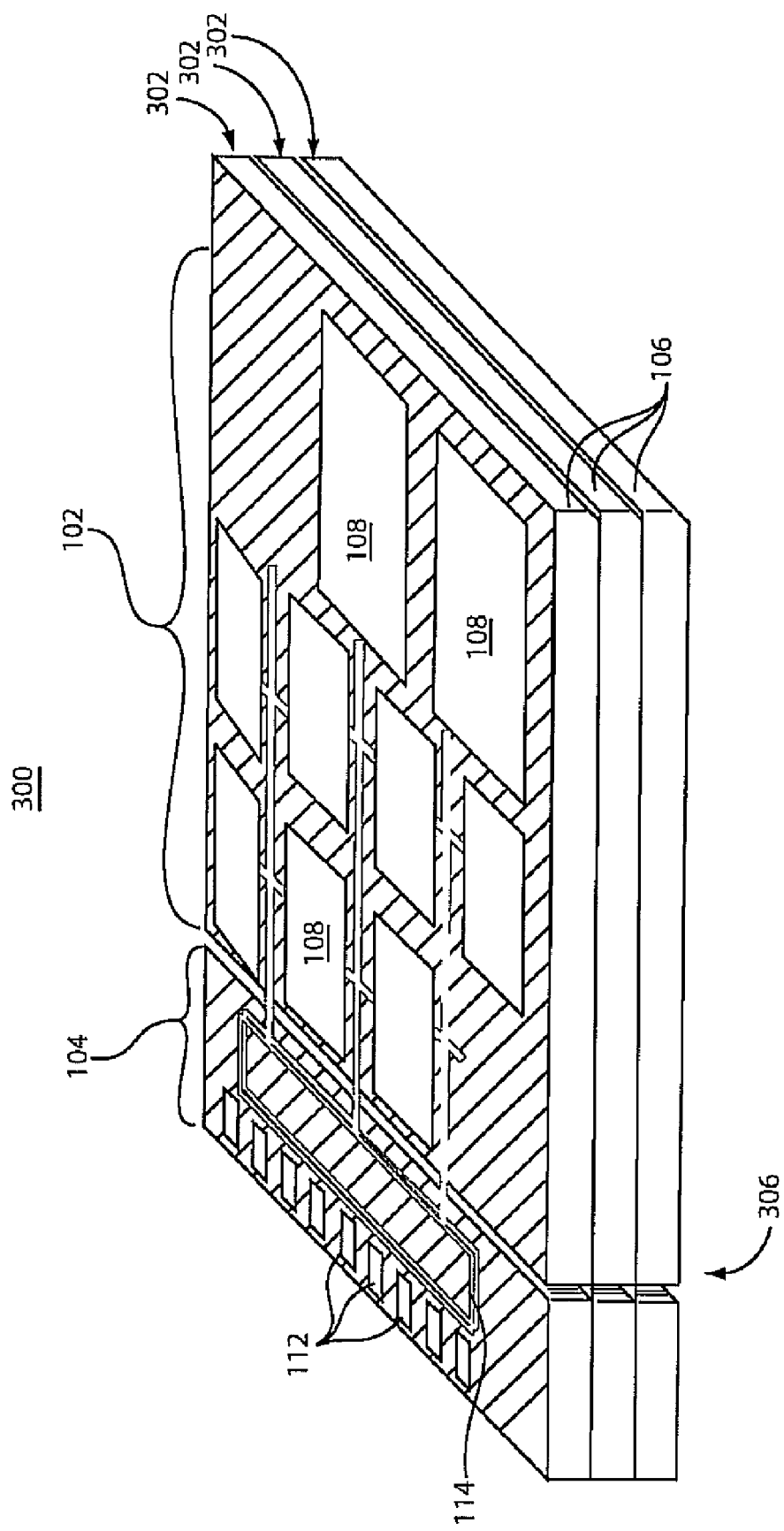
FIG. 5 is a perspective view showing layers joined to form a three-dimensional integrated circuit structure having disposable built-in self-test portions for each layer.

Referring to FIG. 5, a three-dimensional integrated circuit chip 300 is illustratively shown in accordance with one embodiment. Chip or structure 300 includes a plurality of layers 302, each having a chip portion 102 and a self-test portion 104. Each layer's chip portion 102 and self-test portion 104 share a common substrate 106.

In this embodiment, the layers 302 are connected and tested together. Self-test portions 104 may each be employed to test their respective layer or be employed together to test the entire chip 300 or portions thereof.

After testing, the self-test portions 104 may be detached from portions 102, by e.g., dicing all the portions 104 at once at line 306.

Figure 6:
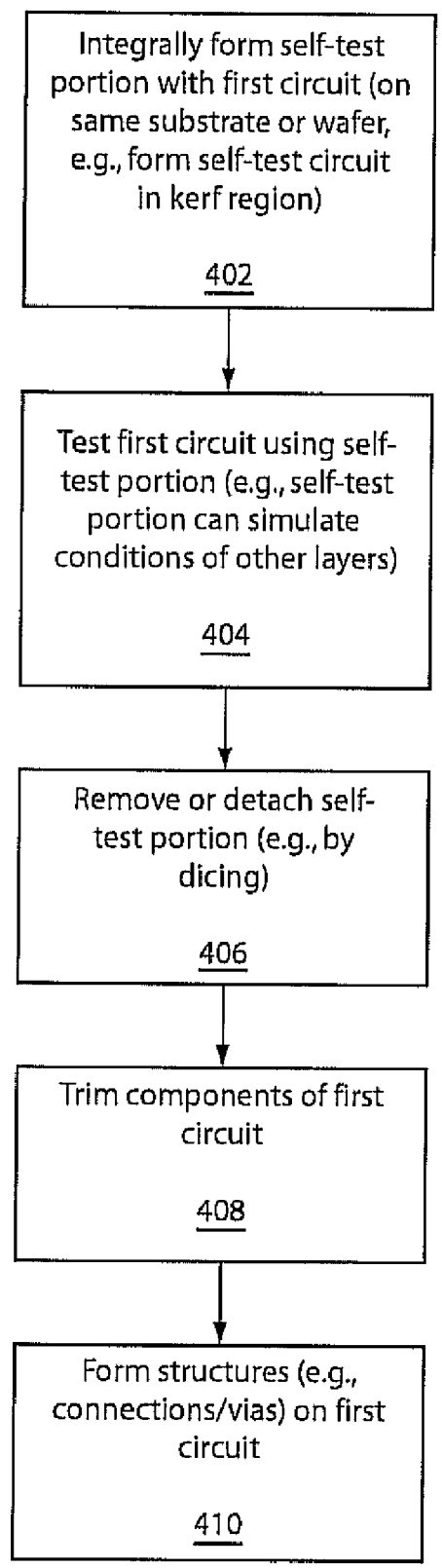
FIG. 6 is a flow diagram showing a method for testing a circuit and detaching a self-test portion from the circuit in accordance with an illustrative embodiment.

Referring to FIG. 6, a flow diagram depicts a method for testing and assembling a three-dimensional integrated circuit in accordance with an illustrative embodiment. In block 402, a disposable self-test circuit is integrally formed on a common substrate with a first circuit or circuit chip to be tested. The first circuit is preferably one of a plurality of layers that is employed in forming a layer in a three-dimensional integrated circuit structure.

The disposable self-test circuit and the first circuit are preferably formed in a same fabrication process. For example, the self-test circuit and the first circuit may be formed concurrently on a same wafer. In one embodiment, the self-test circuit is disposed in a kerf region so that when the self-test circuit is removed the chip for the first circuit that remains is as originally intended (without the self-test circuit) and wafer area is conserved since the kerf area is generally not employed for production chips.

In block 404, upon completion of sufficient circuitry, testing of the first circuit using circuitry of the self-test circuit can be performed. The self-test circuit preferably employs built-in self-test circuits that simulate conditions of an assembled three-dimensional integrated circuit chip for which the first chip is a component. In other words, if the first circuit is intended to be a layer in the three-dimensional circuit, the loads, connections, power and data that would be exchanged or employed between the layers may be simulated by the self-test circuitry. The self-test circuit may include at least one of wiring, structures, and devices to enable the first chip to function under operating conditions.

In block 406, the self-test circuit may be removed by detaching the self-test circuit from the first circuit. Removing the self-test circuit may include dicing the common substrate. In block 408, remaining connections, e.g., connection wires or components may be trimmed on the first circuit. The trimming may be performed by laser ablation, etching or other processes.

In block 410, connection structures may be formed and configured for connecting to other layers of the three-dimensional integrated circuit chip. In one example vias are formed to connect circuits of the first circuit to other layers. Other structures and layers may also be formed. For example, metal lines and insulating layers may be deposited, etched or otherwise patterned on the layer. Blocks 408 and 410 may be performed prior to removing the self-test portion in block 406.

Figure 7:
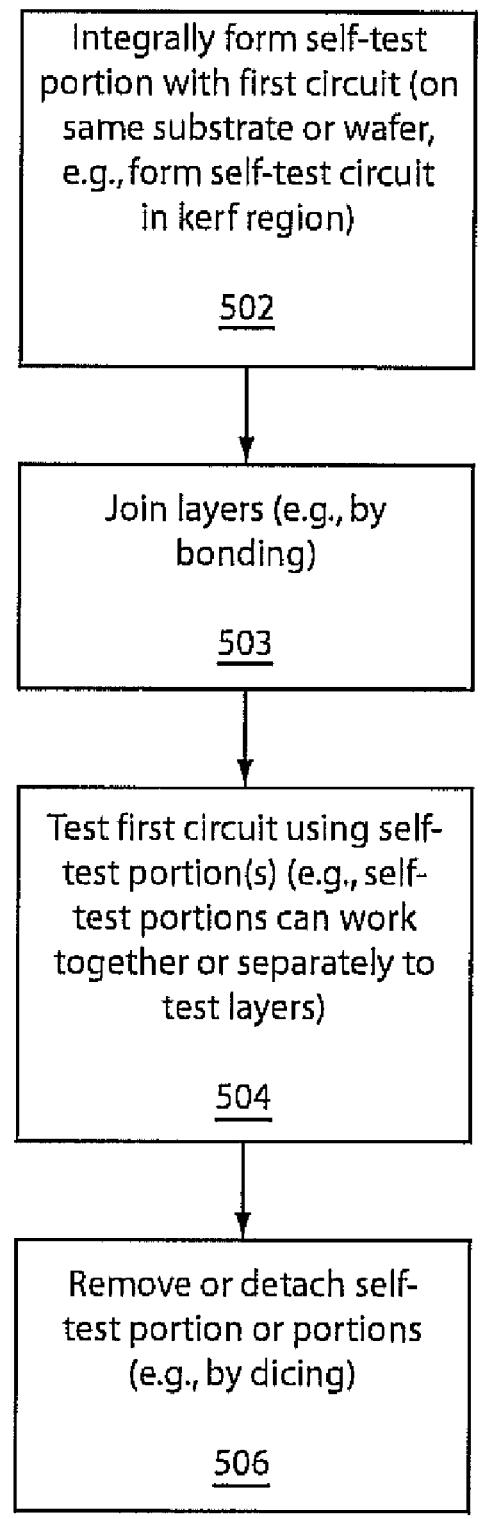
FIG. 7 is a flow diagram showing a method for assembling and testing a three-dimensional integrated circuit structure and detaching a self-test portion(s) from the structure in accordance with an illustrative embodiment.

Referring to FIG. 7, in another embodiment, a method for self-testing an integrated circuit layer for a three-dimensional integrated circuit is illustratively described. In block 502, a disposable self-test circuit is integrally formed on a common substrate with a first circuit to be tested as described in block 402. The first circuit forms a layer in a three-dimensional integrated circuit structure. The self-test circuit and the first circuit are preferably formed in a same fabrication process on a same wafer or substrate. The self-test circuit is preferably disposed in a kerf region of the wafer.

In block 503, the first circuit having the self-test circuit is joined to at least one other layer to form the three-dimensional integrated circuit structure. Joining the first circuit to at least one other layer may include wafer or chip bonding the first circuit to at least one other layer. Prior to bonding the layers, connection structures and trimming may be performed to one or more layers. In addition, each layer may have its own self-test portion.

In block 504, the three-dimensional integrated circuit structure is tested using circuitry of the self-test circuit or circuits. The self-test circuits of each layer may be employed together to test all or a portion of the three-dimensional structure, or each self-test portion may be employed to test its own corresponding layer. Built-in self-test circuits of the self-test circuits are preferably employed to test one or more layers of the three-dimensional integrated circuit chip.

In block 506, the self-test circuit or circuits are removed by detaching the self-test circuit from the first circuit and/or the other layers. In one embodiment, at least one other layer and the first circuit each include a self-test circuit and all layers are diced to remove or detach the self-test circuits.

Applications: While the present embodiments are described in terms of layers in a three-dimensional structure, the teachings in accordance with the present principles are useful in many applications. For example, chip-to-chip or wafer-to-wafer bonding applications where chips or wafers are bonded together, self-test circuits may be employed to determine 'good' chips or wafers and these 'good' chips or wafers are assembled with 'good' chips or wafers of the other layers. The pads and BIST areas are discarded.

In full wafer bonding, working dies are tagged, so that after bonding, only known good chips are fully tested. Pads and BIST areas can be discarded after final chip dicing. This saves final test costs. Similarly, for silicon carriers, self-test portions may be employed to identify known good dies to mount on a carrier. The BIST portion can then be removed.

Having described preferred embodiments for disposable built-in self-test devices, systems and methods for testing three dimensional integrated circuits (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for self-testing an integrated circuit layer for a three-dimensional integrated circuit, comprising:
   integrally forming a disposable self-test circuit on a common substrate with a first circuit to be tested, the first circuit for forming a layer in a three-dimensional integrated circuit structure;
   testing the first circuit using circuitry of the self-test circuit by employing the self-test circuit to simulate conditions of an assembled three-dimensional integrated circuit chip for which the first chip is a component; and
   removing the self-test circuit by detaching the self-test circuit from the first circuit.

2. The method as recited in claim 1, wherein the integrally forming a disposable self-test circuit on a common substrate includes forming the self-test circuit and the first circuit in a same fabrication process.

3. The method as recited in claim 1, wherein the integrally forming a disposable self-test circuit on a common substrate includes forming the self-test circuit and the first circuit on a same wafer where the self-test circuit is disposed in a kerf region.

4. The method as recited in claim 1, wherein the self-test circuit includes at least one of wiring, structures, and devices to enable the first chip to function under operating conditions.

5. The method as recited in claim 1, wherein removing the self-test circuit includes dicing the common substrate.

6. The method as recited in claim 1, further comprising trimming connection wires of the first circuit.

7. The method as recited in claim 1, further comprising forming connection structures configured for connection to other layers of the three-dimensional integrated circuit chip.

8. A method for self-testing an integrated circuit layer for a three-dimensional integrated circuit, comprising:
   integrally forming a disposable self-test circuit on a common substrate with a first circuit to be tested, the first circuit for forming a layer in a three-dimensional integrated circuit structure;
   joining the first circuit having the self-test circuit to at least one other layer to form the three-dimensional integrated circuit structure wherein the at least one other layer and the first circuit each include a self-test circuit;
   testing the three-dimensional integrated circuit structure using circuitry of the self-test circuit; and removing the self-test circuits by detaching the self-test circuits from the first circuit and the at least one other layer by dicing all layers to remove the self-test circuits.

9. The method as recited in claim 8, wherein the integrally forming a disposable self-test circuit on a common substrate includes forming the self-test circuit and the first circuit in a same fabrication process.

10. The method as recited in claim 8, wherein the integrally forming a disposable self-test circuit on a common substrate includes forming the self-test circuit and the first circuit on a same wafer where the self-test circuit is disposed in a kerf region.

11. The method as recited in claim 8, wherein testing the first circuit using circuitry of the self-test circuit includes employing built-in self-test circuits of the self-test circuit to test one or more layers of the three-dimensional integrated circuit chip.

12. The method as recited in claim 8, wherein joining the first circuit to at least one other layer includes wafer or chip bonding the first circuit to at least one other layer.

13. An integrated circuit, comprising:
a first chip portion configured to be integrated in a three-dimensional integrated circuit structure; and
a self-test portion integrated on a same substrate with the first chip portion, the self-test portion including circuitry configured to test the first chip portion and the self-test portion being configured to be detachable from the first chip portion to permit disposal of the self-test portion after testing the first chip portion wherein the circuitry of the self-test portion includes built-in self-test circuits to simulate conditions of an assembled three-dimensional integrated circuit structure for which the first chip portion is a component.

14. The circuit as recited in claim 13, wherein the same substrate include a wafer and the self-test portion is formed in a kerf region of the wafer.

15. The circuit as recited in claim 13, wherein the self-test portion includes at least one of wiring, structures, and devices to enable the first chip portion to function under operating conditions.

16. The circuit as recited in claim 13, wherein the self-test portion includes probe pads configured for at least one of making measurements and providing power to the circuit.

17. The method as recited in claim 13, further comprising trimmable connection wires which connect the first circuit portion with the self-test portion.

18. The circuit as recited in claim 13, further comprising connection structures formed on the first circuit portion and configured for connecting to other layers of the three-dimensional integrated circuit structure.

19. A three-dimensional integrated circuit, comprising:
a first chip portion;
at least one other layer bonded to the first chip portion to form a three-dimensional integrated chip, the at least one other layer including functional devices which interact with circuitry formed on the first chip portion; and
a self-test portion integrated on a same chip substrate with the first chip portion after removal from a wafer, the self-test portion including circuitry configured to test at least the first chip portion and the self-test portion being configured to be detachable from the first chip portion by severing the chip substrate to permit disposal of the self-test portion after testing at least the first chip portion.

20. The circuit as recited in claim 19, wherein the same substrate is removed from the wafer such that the self-test circuit is formed in a kerf region of the wafer.

21. The circuit as recited in claim 19, wherein the at least one other layer includes a self-test portion integrated on a same substrate with the at least one other layer, the self-test portion including circuitry configured to test at least the at least one other layer and the self-test portion being configured to be detachable from the at least one other layer to permit disposal of the self-test portion after testing the at least one other layer.

22. The circuit as recited in claim 19, wherein the self-test circuit includes probe pads configured for at least one of making measurements and providing power to the circuit.

* * * * *